(12) United States Patent
Shizuno

(10) Patent No.: US 7,049,224 B2
(45) Date of Patent: May 23, 2006

(54) MANUFACTURING METHOD OF ELECTRONIC COMPONENTS EMBEDDED SUBSTRATE

(75) Inventor: Yoshinori Shizuno, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/742,749

(22) Filed: Dec. 23, 2003

(65) Prior Publication Data

US 2005/0064704 A1    Mar. 24, 2005

(30) Foreign Application Priority Data

Sep. 22, 2003    (JP) .............................. 2003/330072

(51) Int. Cl.
*H01L 21/4763* (2006.01)
(52) U.S. Cl. ...................................... 438/637; 438/109
(58) Field of Classification Search ................ 438/109, 438/184, 622, 626, 637, 640
See application file for complete search history.

(56) References Cited

U.S. PATENT DOCUMENTS 6,389,689 B1 *    5/2002    Heo ........................... 29/840
2005/0006142 A1 *    1/2005    Ishimaru et al. ............ 174/262

FOREIGN PATENT DOCUMENTS

JP    2002-110714    4/2002
JP    2002-290006    10/2002

* cited by examiner

*Primary Examiner*—Phuc T. Dang
(74) *Attorney, Agent, or Firm*—Wenderoth, Lind & Ponack, L.L.P.

(57) ABSTRACT

A substrate including an electronic component is manufactured by preparing an electronic component having a terminal portion and a first insulative sheet, and mounting the electronic component to a surface of the first insulative sheet so that the terminal portion is opposed to the first insulative sheet. Then an opening portion is formed in the first insulative sheet so that a surface of the terminal portion is exposed and a conductive material is formed that is extended from the terminal portion to an upper portion of the first insulative sheet.

2 Claims, 2 Drawing Sheets

MANUFACTURING METHOD OF ELECTRONIC COMPONENTS EMBEDDED SUBSTRATE

This application is counterpart of Japanese patent application, Serial Number 330072/2003, filed Sep. 22, 2003, the subject matter of which is incorporated herein by reference.

BACKGROUND OF THE INVENTION

1. Field of the Invention

The present invention relates to a manufacturing method of an electronic components embedded substrate, in which electronic components such as an active element (for example, a transistor composing an electronic circuit) and a positive element (for example, a capacitor and a resistance) are embedded.

2. Description of the Related Art

In recent years, in accordance with high density mounting of electronic components, an electronic components embedded substrate, in which electronic components such as an active element and a positive element are embedded, has been proposed.

According to such a system for embedding the electronic components on the substrate, for example, in the event of incorporating a semiconductor chip and a chip component such as a resistance or a capacitor or the like embedded together on the substrate, since thickness of each component is different, some countermeasures, for example, (1) embedding each component after forming a cavity on a mounted layer for each thickness and (2) using a spacer at a lower part of the mounted layer so that each thickness becomes equal, are required.

These methods (1) and (2) involve a problem such that the number of processes and components is increased due to formation of the cavity and mounting of the spacer, and this makes these methods technologically unsatisfying.

In order to improve such a problem, JP-A-2002-110714 and JP-A-2002-290006 are suggested. In these suggestions, a method to seal a plurality of electronic components having different thicknesses by resin and to make an electronic components embedded substrate are disclosed.

[Patent Document] JP-A-2002-110714
[Patent Document] JP-A-2002-290006

However, according to the above-described JP-A-2002-110714, the electronic components are mounted on an insulative dummy sheet once to be provided with resin sealing, and then, the dummy sheet is peeled off. This dummy sheet is unnecessary in a final configuration.

On the other hand, in JP-A-2002-290006, after setting up a bonding wire on an electrode of the electronic component and performing resin sealing, the resin layer is ground to expose a surface of the bonding wire and planarize it. Therefore, depending on a property of resin and how to perform the resin sealing process, the bonding wire may fall down or a front end position of the bonding wire may be deviated, and this makes it difficult to dispose the front end of the bonding wire at a predetermined position and accurately set a position where an outer terminal (a solder hall) is arranged. In this JP-A-2002-290006, restrains are placed on the property of the resin and the resin sealing process.

Therefore, reduction of the number of the components and the processes and improvement of mass productivity are further expected.

SUMMARY OF THE INVENTION

Accordingly, the present invention has been made taking the foregoing problems into consideration, and an object of the present invention is to provide a manufacturing method of an electronic components embedded substrate, which has a lower number of components and processes and is excellent in mass productivity.

The above-described problems will be solved by the following means.

Namely, the method of manufacturing a substrate including an electronic component, according to the present invention, may includes the steps of: preparing an electronic component having a terminal portion; preparing a first insulative sheet; mounting the electronic component to a surface of the first insulative sheet so that the terminal portion is opposed to the first insulative sheet; forming an opening portion in the first insulative sheet so that a surface of the terminal portion is exposed; and forming a conductive material that is extended from the terminal portion to an upper portion of the first insulative sheet.

According to the method of the present invention, electronic components are mounted on a first insulative sheet. This first insulative sheet may be used as it is without being peeled off, and an opening portion, through which a terminal portion is exposed, is provided by using the first insulative sheet as an interlayer insulative layer, for example, by a buildup method. Further, a conductive member (for example, a wiring layer and an outer terminal) is provided, which is elongated from the terminal portion of the electronic component to the surface of the first insulative sheet through the foregoing opening portion. Thus, even if the electronic components having different thickness are embedded on the substrate, as compared to the above-described methods using the dummy sheet or grinding the resin layer after resin sealing, it is possible to further reduce the number of the components and the processes and to improve its mass productivity.

The method according to the present invention, as a process of protecting the electronic components, may have the step of burying the electronic components that are mounted on the foregoing first insulative sheet on a second insulative sheet and may have the step of sealing the electronic components that are mounted on the foregoing first insulative sheet by resin.

The method according to the present invention, as the first insulative sheet, may use a prepreg or a photosensitive sheet.

Here, a prepreg is obtained by soaking heat-curable resin (for example, epoxy resin, phenol resin or the like) in a base material (for example, paper, glass fabric, glass nonwoven fabric, synthetic resin or the like) and making the heat-curable resin into a half-cured condition.

In addition, for example, a photosensitive sheet is a sheet that is composed of thermoplastic resin (for example, polyamide, polyamide or the like) having a photosensitive site and a sheet that is composed of a filler (for example, silica, calcium carbonate or the like) ingredient of the thermoplastic resin or the like.

More specifically, the method of manufacturing a substrate including an electronic component, according to the present invention, may include the steps of: preparing a first electronic component having a terminal portion on its main surface and having first thickness; preparing a second electronic component having a terminal portion on its main surface and having second thickness that is thicker than the first thickness; preparing a first insulative sheet; mounting the first and second electronic components on the first insulative layer so that the terminal portion is opposed to the first insulative sheet; forming an opening portion in the first insulative sheet so that a surface of the terminal portions of the first and second electronic components are exposed; forming wiring patterns each of which is extended from the corresponding terminal portions of the first and second electronic components to the upper portion of the first insulative sheet; and covering the first and second electronic components by resin.

In addition, the foregoing step of covering the foregoing first and second electronic components by resin may includes a step of preparing the foregoing second insulative sheet and a step of pressing the foregoing second insulative sheet against the foregoing first and second electronic components and burying the foregoing first and second electronic components in the foregoing second insulative sheet.

In addition, the foregoing step of covering the foregoing first and second electronic components by resin may comprise a step of dripping liquid resin on the foregoing first and second electronic components.

In addition, the foregoing step of forming an opening portion on the foregoing first insulative sheet may includes a step of using a photosensitive sheet as the foregoing first insulative sheet, directly exposing and developing the foregoing photosensitive sheet, and forming the foregoing opening portion through which the surfaces of the foregoing terminal portions of the foregoing first and second electronic components are exposed.

The present invention may have a function to reduce the number of the components and the processes and to be excellent in mass productivity.

DESCRIPTION OF THE PREFERRED EMBODIMENTS

Figure 1A:
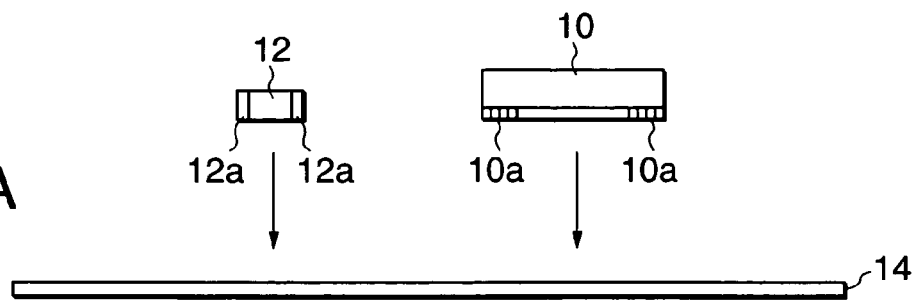
FIGS. 1A–1E are process drawings showing a manufacturing method of an electronic components embedded substrate according to a first embodiment of the present invention.

The embodiments according to the present invention will be described in detail below with reference to the accompanying drawings. With respect to substantially identical functional parts, identical reference numerals are given through all drawings and the explanations thereof may be omitted according to the circumstances.

First Embodiment

FIGS. 1A–1E are process drawings showing a manufacturing method of an electronic components embedded substrate according to the first embodiment of the present invention.

According to the present embodiment, at first, for example, a prepreg for mounting 14 (a first insulative sheet) for mounting the electronic components in a half-cured condition thereon, in which epoxy resin is soaked into glass nowoven fabric, a WCSP 10 (an electronic component) in which a semiconductor chip is packaged, and a rectangular chip component 12 (an electronic component) such as a capacitor and a resistance or the like are prepared (FIG. 1A). This WCSP 10 and the chip component 12 have different thicknesses, and according to the present embodiment, a first electronic component having a first thickness may correspond to the chip component 12 and a second electronic component having a second thickness thicker than the first thickness may correspond to the WCSP 10.

In this case, the WCSP (Wafer Level Chip Size Package or Wafer Level Chip Scale Package) and its MCP (Multi Chip Package) may have a substantially identical outer measurement as a chip size that is obtained by packaging in a wafer level and separating the package. Then, the WCSP is secured to be a completely good quality product in a package condition. Such WCSP is disclosed, for example, in JP-A-9-64049.

Figure 1B:

In the next place, on the prepreg for mounting 14, a plurality of the WCSP 10 and the chip component 12 having the different thicknesses is mounted (FIG. 1B). In this case, the WCSP 10 as the electronic component and the chip component 12 are mounted on the prepreg for mounting 14 so that their terminals 10a and 12a, respectively, may face the prepreg for mounting 14. In the case of the WCSP 10, the terminal portion 10a is disposed on a main surface of the chip, where an integrated circuit is formed.

As a fixing method of the WCSP 10 as the electronic component and the chip component 12, a method to fix them by using an adhesive bond or a method to fix them by mounting the electronic components under the condition that the prepreg is heated over its softening temperature may be available. However, the fixing method is not limited to these.

Figure 1C:
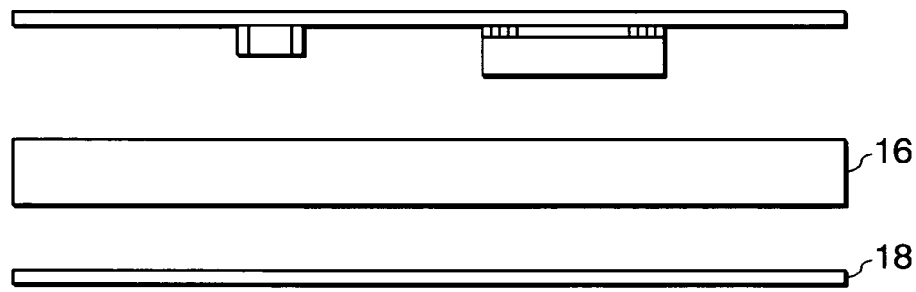

Then, a prepreg for burying 16 to bury the WCSP 10 and the chip component 12 (a second insulative sheet) and a prepreg for protecting 18 to protect the surface of the prepreg for burying 16 are prepared (FIG. 1C).

Figure 1D:
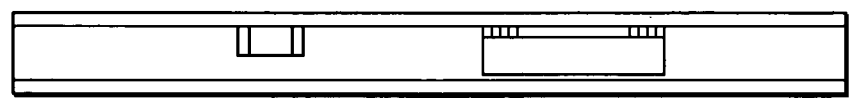

In the next place, after superimposing the prepreg for mounting 14, on which the WCSP 10 and the chip component 12 are mounted, the prepreg for burying 16, and the prepreg for protecting 18, for example, they are heated and pressurized over the softening temperature of the prepreg for burying 16 and the WCSP 10 and the chip component 12 are buried on the prepreg for burying 16 to be protected. Further, the three prepregs are laminated (FIG. 1D).

Figure 1E:
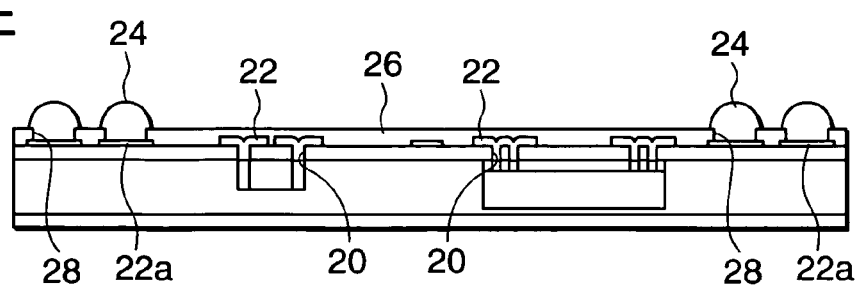

After that, using the prepreg for mounting 14 as the interlayer insulative layer, the following buildup method will be applied (FIG. 1E).

At first, a laser (for example, a $CO_2$ laser, a UV-YAG laser or the like) is irradiated on the portion of the prepreg for mounting 14 located on the terminal 10a of the WCSP 10 and the portion of the prepreg for mounting 14 located on the terminal 12a of the chip component 12 to form a via opening portion 20, and further, to expose the terminal 10a of the WCSP 10 and the terminal 12a of the chip component 12.

In the next place, a conductive layer is formed by plating or the like on the surface of the prepreg for mounting 14 including the via opening portion 20. Consequently, a photo resist is formed on this conductive layer. This photo resist is exposed and developed into a predetermined shape, and then, the conductive layer is patterned by using this photo resist as a mask. After that, the photo resist may be removed. As a result, a wiring layer 22 that is patterned into a predetermined shape is obtained. An end of this wiring layer 22 is located on the terminal 10a of the WCSP 10 and the terminal 12a of the chip component 12, and the other end thereof is located on the surface of the prepreg for mounting 14, which is remote from the WCSP 10 and the chip component 12. In other words, the wiring layer 22 is elongated from the terminal of each electronic component to the surface of the prepreg for mounting 14. The other end of the wiring layer 22 is a land portion 22a where a solder ball 24 (to be described later) is formed.

In the next place, a solder resist film 26 as a surface protecting layer is formed all over the prepreg for mounting 14. After that, a photo resist may be formed on the prepreg for mounting 14, and then, this photo resist is exposed and developed, and by using this photo resist as a mask, a solder-resist film 26 placed on the land portion 22a (the other end) of the wiring layer 22 is removed by etching to form an opening portion 28. Then, in this opening portion 28, the solder ball 24 is provided.

A buildup method of a single layer is described as above. If a multilayer configuration is needed, layer stack of the prepreg layer, formation of the via opening portion, and formation of the wiring layer may be repeated.

According to the present embodiment, as the buildup method, an embodiment forming the via opening portion 20 is described. However, an embodiment forming a through hall (th) and an inductor or the like may be possible.

As described above, according to the present embodiment, the prepreg for mounting 14 (the first insulative sheet), on which the WCSP 10 and the chip component 12 are mounted on a predetermined position, is used as the interlayer insulative layer as it is, and by the buildup method, the wire configuration is formed on this prepreg for mounting 14. This makes it possible to reduce the number of the components and the processes.

Second Embodiment

FIGS. 2A–2F are process drawings showing a manufacturing method of an electronic components embedded substrate according to a second embodiment of the present invention.

Figure 2A:
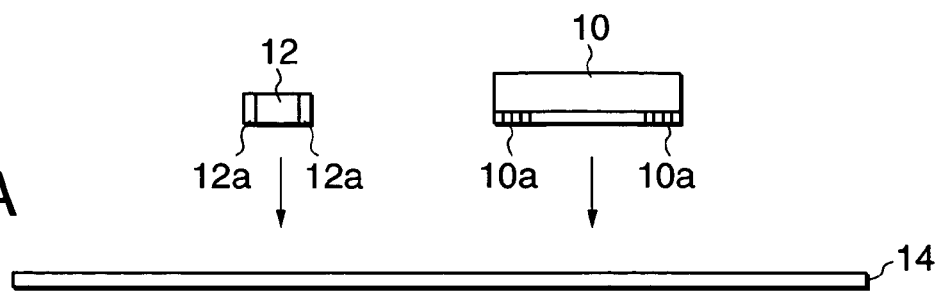
FIGS. 2A–2F are process drawings showing a manufacturing method of an electronic components embedded substrate according to a second embodiment of the present invention.
Figure 2B:
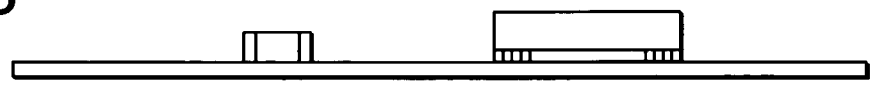
Figure 2C:
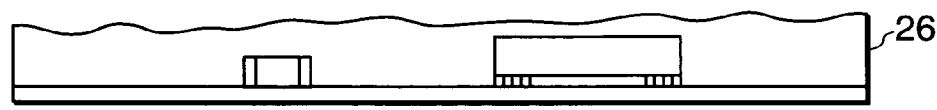
Figure 2D:
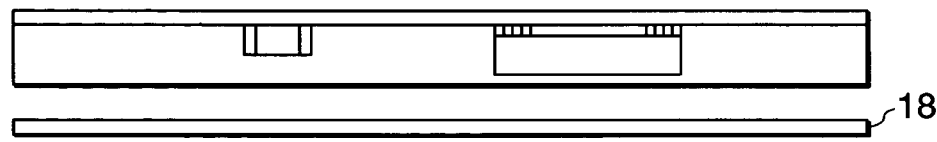
Figure 2E:
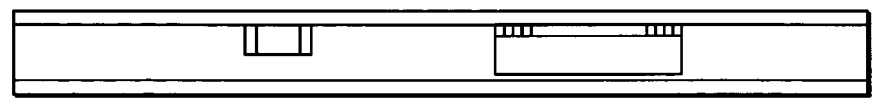
Figure 2F:
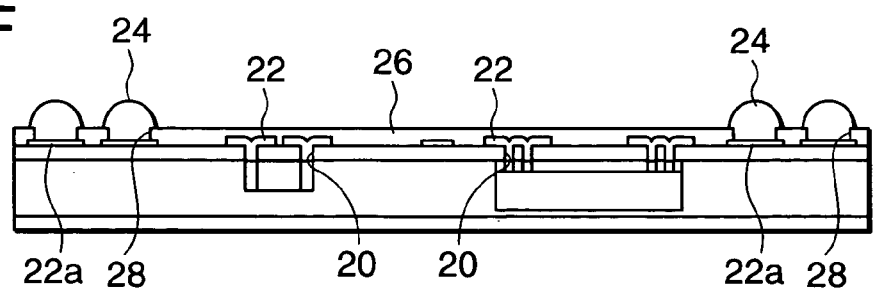

According to the present embodiment, without using the prepreg for burying 16, a plurality of the WCSP 10 and the chip components 12 having the different thicknesses is mounted on the prepreg for mounting 14 (FIG. 2B), and then, sealing resin 26, which is obtained by dripping liquid resin from rear surface sides of the WCSP 10 and the chip component 12 to the WCSP 10 and the chip component 12 and solidifying the liquid resin by heating (curing), may seal the WCSP 10 and the chip component 12(FIG. 2C). Then, preparing the prepreg for protecting 18 (FIG. 2D), in accordance to need, the surface of the sealing resin 26 is ground and planarized. After that, the prepreg for protecting 18 is laminated thereon (FIG. 2E). Then, the buildup method is applied (FIG. 2F). Since the other processes are identical with those of the above-described first embodiment, their explanations are omitted.

According to the present embodiment, since the WCSP 10 as the electronic component and the chip component 12 are simply resin-sealed by the sealing resin 26, which is obtained by dripping liquid resin from rear surface sides of the WCSP 10 and the chip component 12 to the WCSP 10 and the chip component 12 and solidifying the liquid resin by heating (curing), as compared to the first embodiment, it is possible to protect the WSCP 10 and the chip component 12 without adding pressure and to manufacture the electronic components embedded substrate without applying stress to the WCSP 10 as the electronic component and the chip component 12. Therefore, a highly reliable electronic components embedded substrate can be obtained.

Third Embodiment

According to the present embodiment, an insulative photosensitive sheet may be used as the prepreg for mounting 14, and upon forming the via opening portion 20 in the buildup method, as indicated below, a photo lithography method may be adopted (refer to FIG. 1E or FIG. 2F). Other than this, the present invention is identical with the above-described first or second embodiment, so that the explanation except for this portion is herein omitted.

At first, in FIG. 1E or FIG. 2F, after a pattern of a photo mask is exposed and copied directly on the prepreg for mounting 14, the prepreg for mounting 14 is developed, and a portion of the prepreg for mounting 14 placed on the terminal 10a of the WCSP 10 and a portion thereof placed on the terminal 12a of the chip component 12 are removed to form the via opening portion 20 and to expose the terminal 10a of the WCSP 10 and the terminal 12a of the chip component 12.

In the next place, a conductive layer is formed by plating or the like on the surface of the prepreg for mounting 14 including the via opening portion 20. Consequently, a photo resist is formed on this conductive layer. This photo resist is exposed and developed into a predetermined shape, and then, the conductive layer is patterned by using this photo resist as a mask. After that, the photo resist may be removed. As a result, the wiring layer 22 that is patterned into a predetermined shape is obtained. An end of this wiring layer 22 is located on the terminal 10a of the WCSP 10 and the terminal 12a of the chip component 12, and the other end thereof is located on the surface of the prepreg for mounting 14, which is remote from the WCSP 10 and the chip component 12. In other words, the wiring layer 22 is elongated from the terminal of each electronic component to the surface of the prepreg for mounting 14. The other end of the wiring layer 22 is the land portion 22a where the solder ball 24 (to be described later) is formed.

In the next place, the solder resist film 26 as a surface protecting layer is formed all over the prepreg for mounting 14. After that, a photo resist may be formed on the prepreg for mounting 14. Then, this photo resist is exposed and developed, and by using this photo resist as a mask, the solder-resist film 26 placed on the land portion 22a (the other end) of the wiring layer 22 is removed by etching to form the opening portion 28. Then, in this opening portion 28, the solder ball 24 is provided.

A buildup method of a single layer is described as above. If a multilayer configuration is needed, layer stack of the prepreg layer, formation of the via opening portion, and formation of the wiring layer may be repeated. Further, as the prepreg layer from a second one and after, formation of a coating by using a liquid photosensitive material in place of a layer of a sheet material may be adopted.

Thus, according to the present embodiment, by using the photosensitive adhesive sheet as the prepreg for mounting 14, the photo lithography method can be adopted upon forming the via opening portion 20, and this results in a further improvement in mass productivity as compared to the above-described first and second embodiment.

According to any one of the above-described embodiments, the configuration with the solder ball 24 provided to the outer terminal, is explained. However, as the same as with a normal daughter board and mother board, a connection within the system may be configured by a connector and a plug or the like.

According to any one of the above-described embodiments, the configuration with the WCSP 10 embedded as the electronic component including the positive element, is explained. However, as this kind of electronic component, not only a MCP (Multi Chip Package) with a plurality of WCSP laminated, but also a system packaged in a wafer condition and a pair of semiconductor chips, may be adopted.

According to any one of the above-described embodiments, the configuration using the rectangular component as the chip component 12 such as the capacitor and the resistance or the like is explained. However, the chip component 12 as the electronic component is not limited to this and the component having an outer terminal on a single plane may be available.

According to any one of the above-described embodiments, the configuration with two electronic components having different thicknesses embedded is explained. However, the electronic component is not limited to this and the number and the sort of the electronic components to be embedded can be appropriately selected.

According to any one of the above-described embodiments, the wire configuration of a single layer is explained. However, a multilayer wire configuration may be available.

According to any one of the above-described embodiments, the configuration using, as the insulative sheet, the prepreg for mounting 14 and the photosensitive sheet are explained, and in the prepreg for mounting 14 and the photosensitive sheet, a copper foil layer may be formed in advance, or the electronic components may be embedded in advance.

The present invention should not be interpreted in a limited way by any of the above-described embodiments, and it is a matter of course that the present invention can be realized within a range satisfying the requirements of the present invention.

What is claimed is:

1. A method of manufacturing a substrate including an electronic component, the method comprising:
    preparing an electronic component having a terminal portion;
    preparing a first insulative sheet;
    mounting the electronic component to a surface of the first insulative sheet so that the terminal portion is opposed to the first insulative sheet;
    forming an opening portion in the first insulative sheet so that a surface of the terminal portion is exposed; and
    forming a conductive material that is extended from the terminal portion to an upper portion of the first insulative sheet,
    wherein the first insulative sheet is a photosensitive sheet.

2. A method of manufacturing a substrate including an electronic component, the method comprising:
    preparing a first electronic component having a terminal portion on a main surface thereof and having a first thickness;
    preparing a second electronic component having a terminal portion on a main surface thereof and having a second thickness that is thicker than the first thickness;
    preparing a first insulative sheet;
    mounting the first and second electronic components on the first insulative sheet so that the terminal portions thereof are opposed to the first insulative sheet;
    forming opening portions in the first insulative sheet so that surfaces of the terminal portions of the first and second electronic components are exposed;
    forming wiring patterns each of which is extended from the corresponding terminal portions of the first and second electronic components to the upper portion of the first insulative sheet; and
    covering the first and second electronic components with resin,
    wherein the forming of the opening portions in the first insulative sheet comprises using a photosensitive sheet as the first insulative sheet, directly exposing and developing the photosensitive sheet, and forming the opening portions through which the surfaces of the terminal portions of the first and second electronic components are exposed.

* * * * *